United States Patent
Amick et al.

(10) Patent No.: US 6,873,503 B2
(45) Date of Patent: Mar. 29, 2005

(54) SSTL PULL-UP PRE-DRIVER DESIGN USING REGULATED POWER SUPPLY

(75) Inventors: Brian W. Amick, Austin, TX (US); Lynn Warriner, Round Rock, TX (US); Claude R. Gauthier, Cupertino, CA (US); Tri Tran, San Leandro, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 36 days.

(21) Appl. No.: 10/247,082

(22) Filed: Sep. 19, 2002

(65) Prior Publication Data
US 2004/0057169 A1 Mar. 25, 2004

(51) Int. Cl.[7] .................................................. H02H 3/20
(52) U.S. Cl. ........................................ 361/18; 361/91.1
(58) Field of Search .......................... 361/18, 19, 91.1, 361/91.2, 91.3, 91.4, 111; 326/82, 86, 92, 88

(56) References Cited

U.S. PATENT DOCUMENTS

| | | | |
|---|---|---|---|
| 4,006,491 A | 2/1977 | Alaspa et al. ................. 357/23 |
| 4,430,582 A | 2/1984 | Bose et al. ................. 307/297 |
| 4,887,021 A | * 12/1989 | Walker ........................ 323/279 |
| 5,731,713 A | 3/1998 | Proebsting et al. ........... 326/71 |
| 6,087,885 A | 7/2000 | Tobita ........................ 327/379 |
| 6,172,524 B1 | 1/2001 | Cho ............................. 326/70 |
| 6,300,797 B1 | * 10/2001 | Koizumi ...................... 326/82 |
| 6,317,344 B1 | * 11/2001 | Koizumi et al. ............... 363/60 |
| 6,459,329 B1 | * 10/2002 | Kobayashi et al. ......... 327/538 |

FOREIGN PATENT DOCUMENTS

| | | |
|---|---|---|
| EP | 0 517 375 A2 | 12/1992 |
| EP | 0 517 375 A3 | 12/1992 |
| EP | 0 905 902 A2 | 3/1999 |
| EP | 0 905 902 A3 | 3/1999 |
| GB | 2 241 845 A | 9/1991 |

OTHER PUBLICATIONS

International Search Report for PCT/US 03/24817 mailed May 14, 2004 (5 pages).
Stub Series Terminated Logic for 2.5 V (SSTL_2); JESD8–9 (Revision of JEDS8–9), Dec. 2000, JEDEC Standard, JEDEC Solid State Technology Association (22 pages).

* cited by examiner

*Primary Examiner*—Brian Sircus
*Assistant Examiner*—Danny Nguyen
(74) *Attorney, Agent, or Firm*—Osha & May L.L.P.

(57) ABSTRACT

A SSTL memory interface pre-driver stage that uses a voltage regulator to generate a 'virtual' ground reference voltage is provided. The 'virtual' ground voltage reference, being greater than a zero volt ground voltage, allows low voltage transistors to be used, thereby improving interface performance and decreasing system power consumption. The pre-driver stage uses a biasing circuit to bias the voltage regulator, formed by a transistor arranged in a source follower configuration, to generate the 'virtual' ground reference voltage off which a voltage translator stage of the pre-driver stage operates to generate an output of the pre-driver stage.

10 Claims, 5 Drawing Sheets

SSTL PULL-UP PRE-DRIVER DESIGN USING REGULATED POWER SUPPLY

BACKGROUND OF INVENTION

As shown in FIG. 1, a typical computer system 10 includes at least a microprocessor 12 (often referred to and known as "CPU") and some form of memory 14. The microprocessor 12 has, among other components, arithmetic, logic, and control circuitry that interpret and execute instructions necessary for the operation and use of the computer system 10. Specifically, FIG. 1 shows the computer system 10 having the microprocessor 12, memory 14, integrated circuits (ICs) 16 that have various functionalities, and communication paths 19, i.e., buses and wires, that are necessary for the transfer of data among the aforementioned components of the computer system 10.

In order to keep pace with improving technologies, computer system and circuit designers are constantly trying to improve and get the most out of their designs through the most cost-effective means. As faster versions of a particular CPU become available, a designer will often try to improve the throughput of their existing design by simply increasing the CPU clock frequency. However, after a certain point, the speed of the system's main memory becomes a limiting factor in optimizing the throughput of the system. To this end, designers have produced faster memories, which, in turn, has necessitated high-speed memory interfaces.

One type of design that has been used for high-speed memory interface applications involves the use of stub series termination logic (SSTL). SSTL is a standard created by the Joint Electron Device Engineering Council (JEDEC) to provide a termination scheme for high speed signaling in applications such as DDR-SDRAM. SSTL specifies particular switching characteristics such that high operating frequencies are available. As operating frequencies continue to increase and as the demand for faster memory interfaces has and continues to grow, the STTL interface standard continues to enjoy wide acceptance.

SUMMARY OF INVENTION

According to one aspect of the present invention, an integrated circuit comprises: a voltage translator stage arranged to output a voltage dependent on an input thereto; a biasing circuit arranged to generate a bias signal; a voltage regulator arranged to receive the bias signal and generate a regulated voltage on a terminal thereof; and a gain stage arranged to generate an output dependent on the voltage, where the regulated voltage is arranged to serve as a ground voltage reference for the gain stage, and where the regulated voltage is greater than zero.

According to another aspect, a method for performing a stub series termination logic operation comprises: generating a bias signal dependent on a ground voltage; generating a regulated voltage dependent on the bias signal and the ground voltage; and generating an output signal dependent on an input signal, where the generating the output signal is dependent on the regulated voltage, and where the regulated voltage is greater than the ground voltage.

According to another aspect, an integrated circuit having a core and a memory comprises stub series termination logic circuitry interfaced between the core and the memory, where the stub series termination logic circuitry is arranged to operate off of a ground voltage, and where the stub series termination logic circuitry comprises (1) a pre-driver stage arranged to receive an input signal from the core, where the pre-driver stage comprises: a voltage regulator arranged to operate off of the ground voltage and generate a regulated voltage on a terminal thereof, where a minimum value of the regulated voltage is greater than the ground voltage; a voltage translator stage, operatively connected to the terminal, arranged to output a signal dependent on the input signal and the regulated voltage; a gain stage, operatively connected to the terminal, arranged to generate an output signal dependent on the signal and the regulated voltage, and (2) an output buffer stage arranged to receive and buffer the output signal.

Other aspects and advantages of the invention will be apparent from the following description and the appended claims.

DETAILED DESCRIPTION

In circumstances when a memory interface using SSTL technology is integrated on-chip, there is a likelihood that the supply voltage for the SSTL interface will exceed the voltage tolerances of low-voltage transistors that are designed to operate at voltages below that of the SSTL interface. If a large voltage is placed across one of these low-voltage transistors, the gate oxide layer of the transistor may break down, which, in turn, could cause circuit malfunction.

The present invention uses a voltage regulator device in a pre-driver stage of a SSTL interface to generate a 'virtual' ground reference voltage off which particular circuitry operates to generate a low voltage swing signal dependent on an input to pre-driver stage from a core portion of a microprocessor, where the pre-driver stage operates off of a supply voltage greater than the 'virtual' ground reference voltage.

Figure 1:
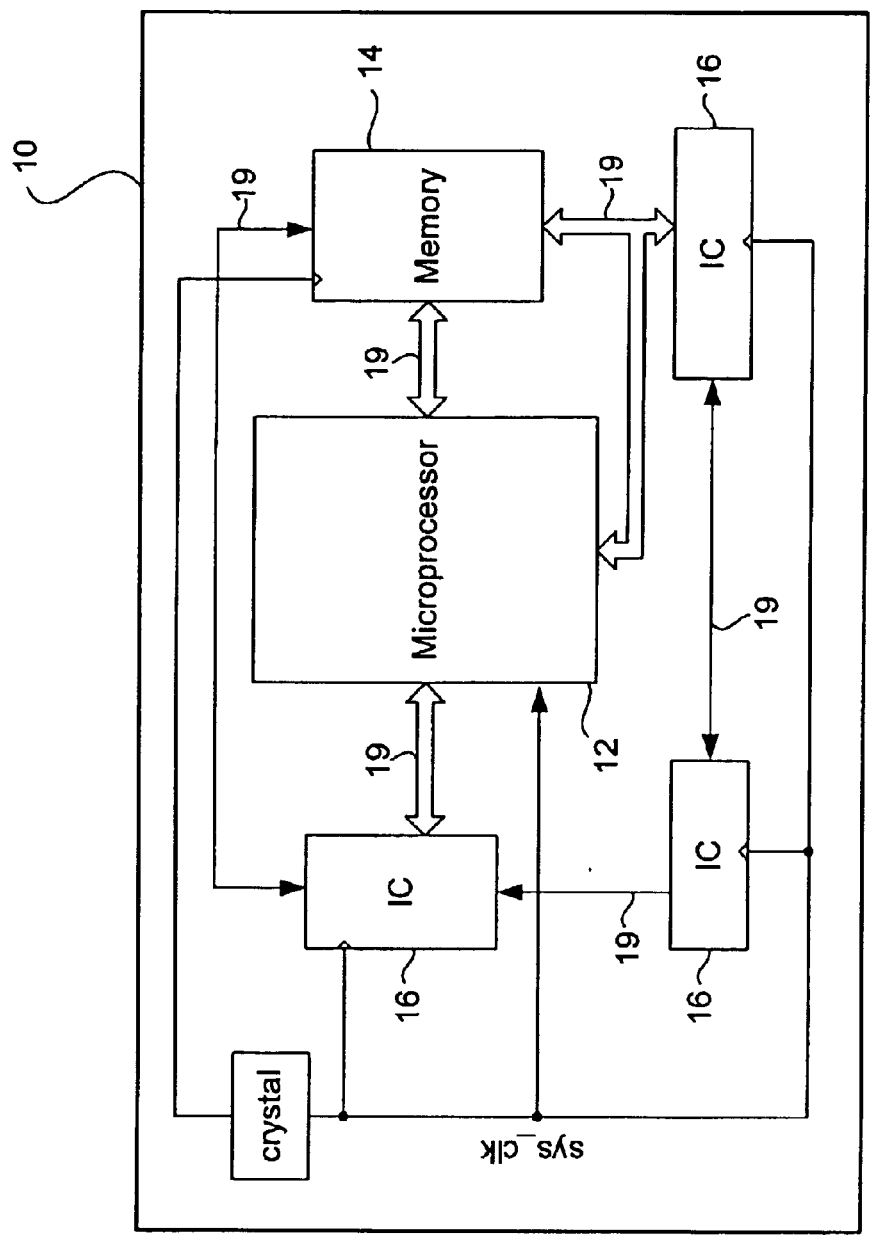
FIG. 1 shows a typical computer system.
Figure 2:
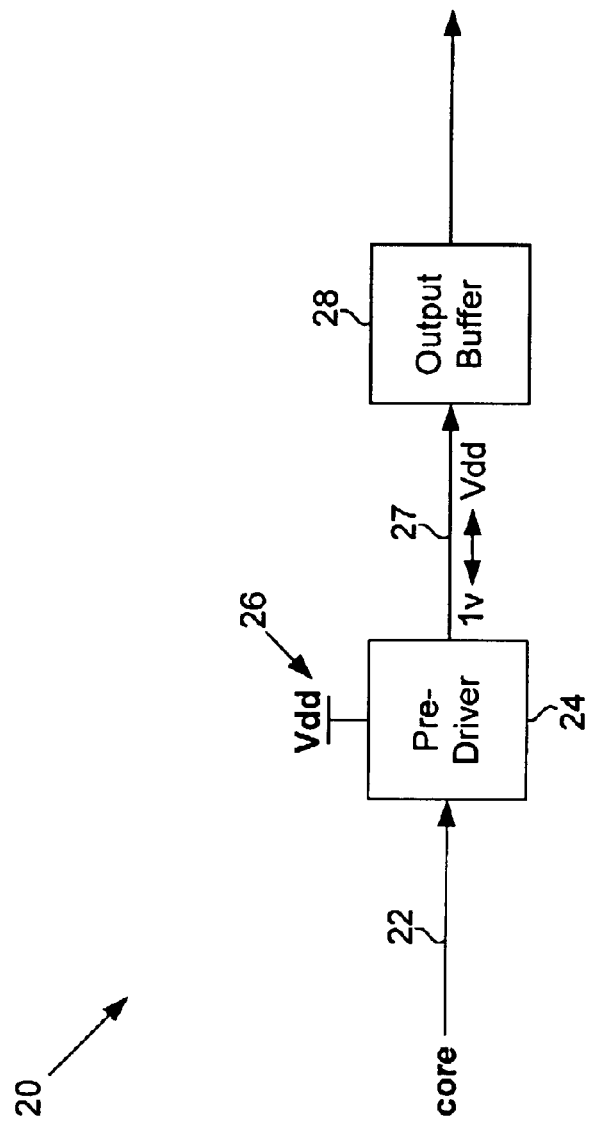
FIG. 2 shows a memory interface in accordance with an embodiment of the present invention.

FIG. 2 shows a block diagram of an exemplary SSTL interface 20 in accordance with an embodiment of the present invention. In FIG. 2, a core signal, core 22 (from a core region (not shown) of the microprocessor on which the SSTL interface 20 is implemented) having a logic value of '0' or '1' serves an input to a pre-driver stage 24 that operates off of a supply voltage Vdd 26. However, due to the types of transistors (not shown) used in the SSTL interface 20, the supply voltage Vdd 26 cannot be placed across the transistors (not shown) without damaging them. Accordingly, the pre-driver stage 24, using a voltage regulator (not shown) (described in detail below with reference to FIGS. 3 and 4) generates a "virtual ground," or regulated voltage, that facilitates the generation of a low voltage swing signal 27 to an output buffer stage 28, where the low voltage swing signal 27 has a voltage swing between some value above 0, e.g., 1 volt, and Vdd 26. Thus, the pre-driver stage 24 may be referred to as a "pull-up pre-driver." Those skilled in the art will understand that the pre-driver stage 24 must provide some gain to the output buffer stage 28 due to the fact that output buffer stage 28 itself may be very large and complex.

Figure 3:
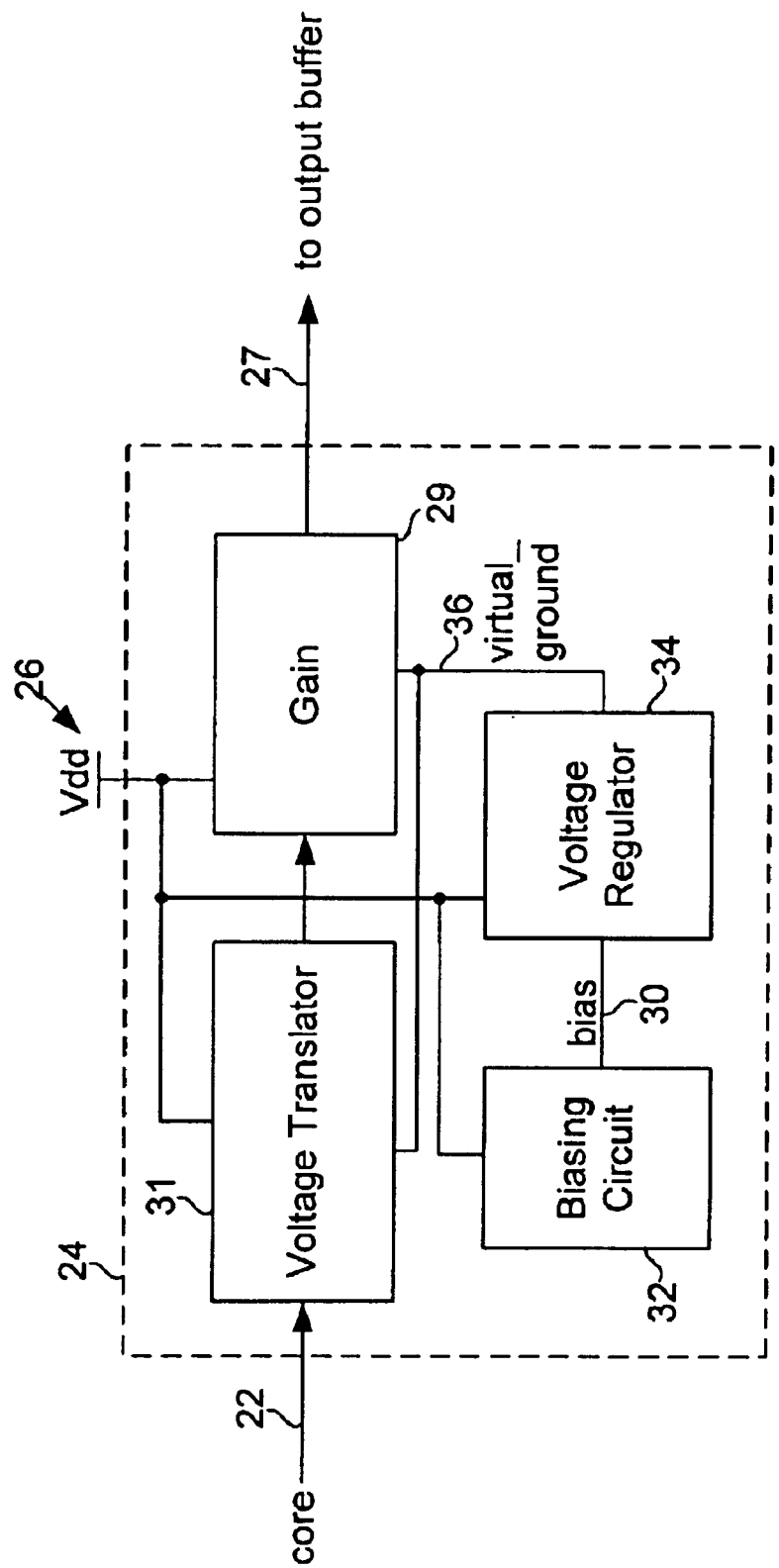
FIG. 3 shows a block diagram of a pre-driver stage in accordance with an embodiment of the present invention.

FIG. 3 shows a block diagram of an exemplary SSTL pre-driver stage 24 in accordance with an embodiment of the present invention. In FIG. 3, the pre-driver stage 24 includes a voltage translator stage 31 (described in detail with reference to FIG. 5), a biasing circuit 32, a voltage regulator 34, and a gain stage 29. The biasing circuit 32 generates a bias signal, bias 30, that is used to bias the voltage regulator 34. The voltage regulator 34, operating off of Vdd 26 (I/O power supply) and dependent on the bias signal 30, generates a regulated or 'virtual' ground reference voltage, virtual_ground 36, which is used by the voltage translator stage 31 and the gain stage 29 as a ground voltage reference. This 'virtual' ground reference voltage 36 is greater than the typical 0 volt ground voltage and is used by the gain stage 29 to generate a low voltage swing signal 27 the output buffer stage (28 in FIG. 2)) dependent on a voltage generated by the voltage translator stage 31. The voltage translator stage 31 generates the voltage to the gain stage 29 dependent on the input core signal (22 in FIG. 2). As described below with reference to FIG. 4, the voltage regulator 34 is arranged to maintain the voltage on the 'virtual' ground reference voltage 36 even when the voltage translator stage 31 or the gain stage 29 draws current from the voltage regulator 32.

Figure 4:
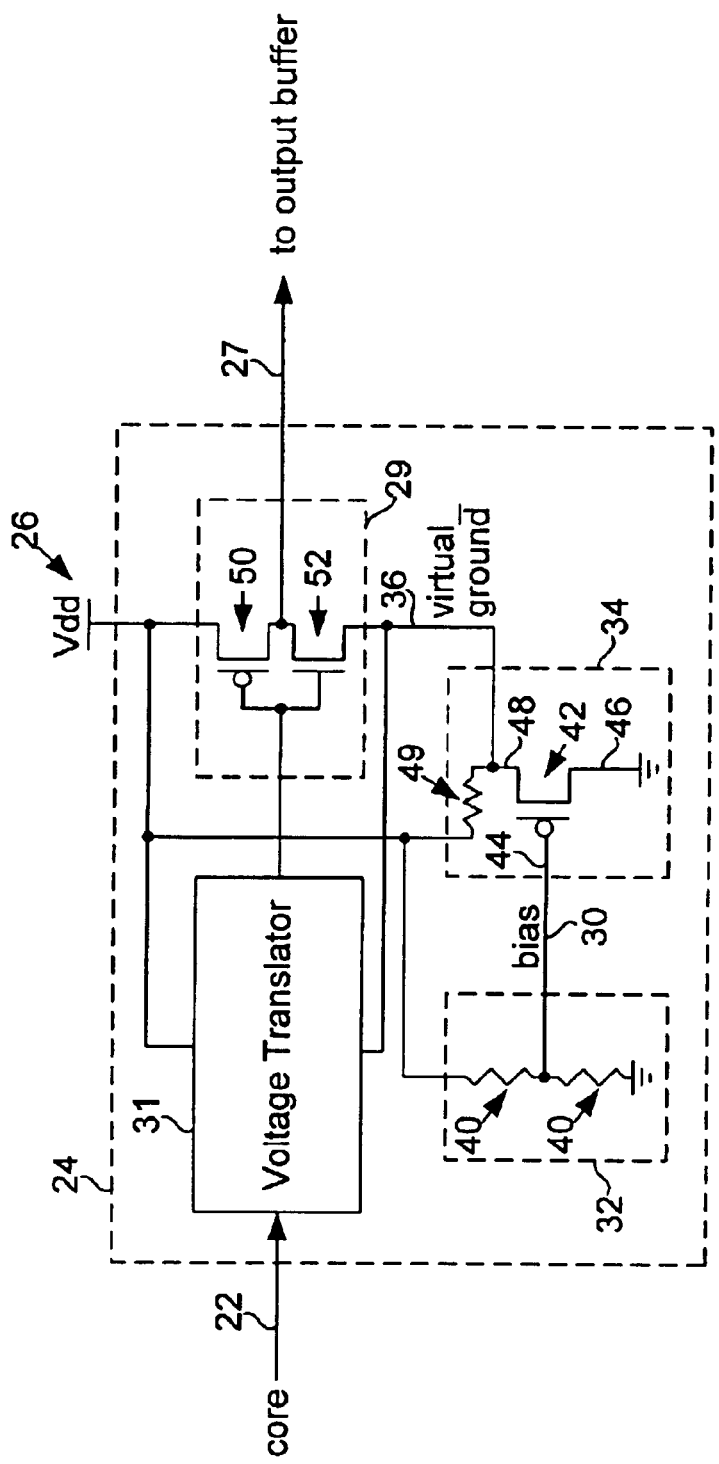
FIG. 4 shows a circuit diagram of a pre-driver stage in accordance with an embodiment of the present invention.

FIG. 4 shows a circuit diagram of an exemplary SSTL pre-driver stage 24 in accordance with an embodiment of the present invention. In FIG. 4, the biasing circuit 32 includes a plurality of resistors 40 that form a voltage divider that generates the bias signal 30 to the voltage regulator 34. The voltage regulator 34 is implemented using a PMOS device 42 that is arranged in a source follower configuration. Particularly, the bias signal 30 is operatively connected to a gate terminal 44 of the PMOS device 42, ground is operatively connected to a drain terminal 46 of the PMOS device 42, and the 'virtual' ground reference voltage 36 is operatively connected to a source terminal 48 of the PMOS device 42. Moreover, the source terminal 48 is connected to some large resistance 49 (that is used to provide a small amount of biasing current to the PMOS device 42) that is connected to Vdd 26. This source follower configuration of the PMOS device 42 causes the source terminal 48 to be pulled to a voltage equal to a voltage of the bias signal 30 at the gate terminal 44 plus the threshold voltage of the PMOS device 42. For example, if the bias signal 30 is at 0.5 volts and the threshold voltage of the PMOS device 42 is 0.5 volts, the source terminal 48, and hence, the 'virtual' ground reference voltage 36 will be at approximately 1 volt.

Those skilled in the art will understand that, in one or more other embodiments, a biasing circuit using a structure other than a voltage divider may be used. For example, a biasing circuit may use active devices, bandgap references, etc. In other words, any biasing circuit that generates one or more bias signals is within the scope of the present invention.

When the voltage translator stage 31 or the gain stage 29 draws current from the voltage regulator 34, the voltage of the 'virtual' ground reference voltage 36 at the source terminal 48 of the PMOS device 42 starts to increase, which, in turn, causes the PMOS device 42 to switch 'on,' i.e., conduct more current, which, in turn, pulls down the voltage at the source terminal 48 of the PMOS device 42 back to the desired voltage of the 'virtual' ground reference voltage 36.

The gain stage 29 has an inverter formed by PMOS transistor 50 and NMOS transistor 52. The input to this inverter is operatively connected to an output from the voltage translator stage 31. When the voltage translator 31 outputs 'high,' the gain stage 29 outputs the virtual_ground 36 voltage. Conversely, when the voltage translator 31 outputs 'low,' the gain stage 29 outputs Vdd 26 to the output buffer (28 in FIG. 2).

Figure 5:
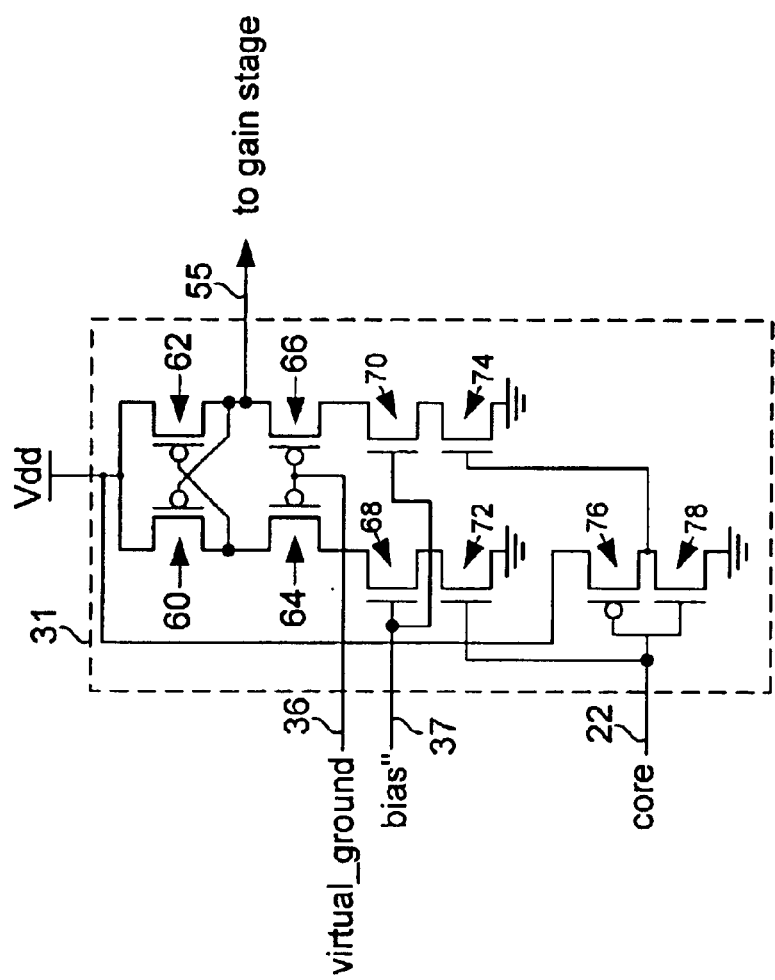
FIG. 5 shows a circuit diagram of a voltage translator in accordance with an embodiment of the present invention.

FIG. 5 shows a circuit diagram of an exemplary voltage translator stage 31 in accordance with an embodiment of the present invention. In FIG. 5, the input core signal 22 serves as an input to NMOS transistor 72 and an inverter formed by PMOS transistor 76 and NMOS transistor 78. When the input core signal 22 is 'high,' NMOS transistor 72 is 'on,' which, in turn causes a ground voltage, i.e., a 'low,' to propagate through NMOS transistor 68 (which is controlled by bias signal bias" 37) and PMOS transistor 64 (which is controlled by virtual_ground 36 (from the voltage regulator 34 shown in FIGS. 3 and 4)). This 'low' then serves as an input to PMOS transistor 62, which, in turn, causes the voltage translator stage 31 to output Vdd due to the connection between the output 55 of the voltage translator stage 31 and Vdd though 'on' PMOS transistor 62.

When the core signal 22 is 'low,' the inverter formed by PMOS transistor 76 and NMOS transistor 78 outputs 'high' to an input of NMOS transistor 74, which, in turn, causes a 'low' to propagate through NMOS transistor 70 (which is controlled by bias signal bias" 37) and PMOS transistor 66 (which is controlled by virtual_ground 36 (from the voltage regulator 34 shown in FIGS. 3 and 4)). This 'low' then propagates to the output 55 of the voltage translator stage 55.

Those skilled in the art will understand that, in one or more embodiments, the bias voltages bias' (in FIG. 4) and bias" (in FIG. 5) may be derived or generated from the biasing circuit 32 (shown in FIGS. 3 and 4).

Further, those skilled in the art will understand that, in one or more embodiments, any voltage translator may be used in the present invention.

Advantages of the present invention may include one or more of the following. In one or more embodiments, because a SSTL pre-driver stage uses a voltage regulator to generate a 'virtual' ground reference voltage, low-voltage transistors, that would otherwise be damaged if directly operated between a supply voltage of the pre-driver stage and zero volts (typical ground voltage), may be used. Accordingly, performance may be increased without an increase in power consumption.

Because a voltage translator typically requires that its supply be equal to the voltage that is can translate to, translating at a high voltage with low-voltage transistors may cause circuit damage. Accordingly, in one or more embodiments of the present invention, because an appropriate regulated voltage is supplied to the translator, transistors and other circuitry are not susceptible to damage.

In one or more embodiments, because the buffering of a signal from a microprocessor uses an I/O power supply, the power supply of the microprocessor may be changed or designed independent of the buffering. In other words, the microprocessor power supply voltage may be changed without affecting the I/O interface.

In one or more embodiments, because a SSTL pre-driver stage uses a voltage regulator with a voltage translator, the pre-driver stage draws very little DC current, which, in turn, reduces power consumption.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
a voltage translator stage arranged to output a voltage dependent on an input thereto;
a biasing circuit arranged to generate a bias signal;
a voltage regulator arranged to receive the bias signal and generate a regulated voltage on a terminal thereof; and
a gain stage arranged to generate an output dependent on the voltage, wherein the regulated voltage is arranged to serve as a ground reference voltage for the gain stage, and wherein the regulated voltage is greater than zero,
wherein the biasing circuit, the voltage regulator, the voltage translator stage, and the gain stage are part of a stub series termination logic pre-driver circuit.

2. An integrated circuit having a core and a memory, comprising:
stub series termination logic circuitry interfaced between the core and the memory, wherein the stub series termination logic circuitry is arranged to operate off of a ground voltage, and wherein the stub series termination logic circuitry comprises:
a pre-driver stage arranged to receive an input signal from the core,
wherein the pre-driver stage comprises:
a voltage regulator arranged to operate off of the ground voltage and generate a regulated voltage on a terminal thereof, wherein a minimum value of the regulated voltage is greater than the ground voltage,
a voltage translator stage, operatively connected to the terminal, arranged to output a signal dependent on the input signal and the regulated voltage,
a gain stage, operatively connected to the terminal, arranged to generate an output signal dependent on the signal and the regulated voltage, and
an output buffer stage arranged to receive and buffer the output signal.

3. The integrated circuit of claim 2, wherein the voltage regulator comprises a device arranged in a source follower configuration.

4. The integrated circuit of claim 2, wherein the voltage regulator comprises a transistor, and wherein the terminal is a source terminal of the transistor.

5. The integrated circuit of claim 4, wherein a drain terminal of the transistor is operatively connected to the ground voltage.

6. The integrated circuit of claim 2, wherein the pre-driver stage further comprises a biasing circuit arranged to produce a bias signal to the voltage regulator.

7. The integrated circuit of claim 6, wherein the biasing circuit comprises a plurality of resistors connected in series.

8. The integrated circuit of claim 6, wherein the voltage regulator comprises a transistor, and wherein the bias signal is operatively connected to a gate terminal of the transistor.

9. The integrated circuit of claim 2, wherein a minimum voltage of the output signal is greater than the ground voltage.

10. The integrated circuit of claim 2, wherein the voltage regulator is arranged to maintain the regulated voltage on the terminal when at least one of the voltage translator stage and the gain stage draws current from the voltage regulator.

* * * * *